(12) United States Patent
Zhang et al.

(10) Patent No.: US 9,472,716 B1
(45) Date of Patent: Oct. 18, 2016

(54) LATTICE-CONSTANT FORMATTED EPITAXIAL TEMPLATE FOR LIGHT EMITTING DEVICES AND A METHOD FOR MAKING THE SAME

(71) Applicant: BOLB INC., San Jose, CA (US)

(72) Inventors: Jianping Zhang, San Jose, CA (US); Hongmei Wang, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 14/671,925

(22) Filed: Mar. 27, 2015

(51) Int. Cl.
| | |
|---|---|
| *H01L 33/06* | (2010.01) |
| *H01L 33/32* | (2010.01) |
| *C30B 25/18* | (2006.01) |
| *C30B 29/40* | (2006.01) |

(52) U.S. Cl.
CPC ............ *H01L 33/06* (2013.01); *C30B 25/183* (2013.01); *C30B 29/403* (2013.01); *C30B 29/406* (2013.01); *H01L 33/32* (2013.01)

(58) Field of Classification Search
CPC ..... H01L 33/06; H01L 33/32; C30B 29/403; C30B 29/406; C30B 25/183
See application file for complete search history.

(56) References Cited

U.S. PATENT DOCUMENTS 5,679,965 A * 10/1997 Schetzina .............. B82Y 20/00 257/103
7,547,925 B2  6/2009 Wong et al.
7,811,847 B2 10/2010 Hirayama et al.

OTHER PUBLICATIONS

C. Q. Chen et al., "AlGaN layers grown on GaN using strain-relief interlayers" Applied Physics Letters, vol. 81, No. 26, Dec. 23, 2002, pp. 4961-4963.
J. P. Zhang et al., "Crack-free thick AlGaN grown on sapphire using AlN/AlGaN superlattices for strain management" Applied Physics Letters, vol. 80, No. 19, May 13, 2002, pp. 3542-3544.
J. P. Zhang et al., "Milliwatt power deep ultraviolet light-emitting diodes over sapphire with emission at 278 nm" Applied Physics Letters, vol. 81, No. 26, Dec. 23, 2002, pp. 4910-4912.
J. P. Zhang et al., "Pulsed atomic-layer epitaxy of ultrahigh-qualityAlxGa1-xN structures for deep ultraviolet emissions below 230 nm" Applied Physics Letters, vol. 81, No. 23, Dec. 2, 2002, pp. 4392-4394.
Jianyun Shen et al., "Calculated strain energy of hexagonal epitaxial thin films" Journal of Crystal Growth, vol. 240, (2002), pp. 6-13.

* cited by examiner

*Primary Examiner* — Kyoung Lee
(74) *Attorney, Agent, or Firm* — J.C. Patents (57) ABSTRACT

A lattice constant formatted epitaxial template for light emitting devices includes a starting epitaxial template having a base, a plurality of alternately arranged protrusions and depressions on the base; first material portions epitaxially formed on top of the protrusions and second material portions epitaxially formed in the depressions, wherein lattice constants of the first material portions on the protrusions are different from those of the second material portions in the depressions. A method for making a lattice constant formatted epitaxial template is provided. Also provided is a light emitting device containing a lattice constant formatted epitaxial template.

22 Claims, 7 Drawing Sheets

FIG. 11

LATTICE-CONSTANT FORMATTED EPITAXIAL TEMPLATE FOR LIGHT EMITTING DEVICES AND A METHOD FOR MAKING THE SAME

FIELD OF THE INVENTION

The present invention relates in general to a lattice-constant formatted epitaxial template for semiconductor light emitters, more particularly for group III nitride compound semiconductor ultraviolet light or visible light emitters, a method of forming the same, and a light emitting device containing a lattice constant formatted epitaxial template.

DESCRIPTION OF THE RELATED ART

Nitride compound semiconductors such as InN, GaN, AlN, and their ternary and quaternary alloys are viewed as very important optoelectronic materials. Depending on alloy composition, nitride compounds can enable ultraviolet (UV) emissions ranging from 410 nm down to approximately 200 nm. This includes UVA (400-315 nm), UVB (315-280 nm), and part of UVC (280-200 nm) regimes. UVA emissions are leading to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity & dosage, which is ideal treatment for fresh food, water and surface storage, disinfection, and sterilization. Further, the light output can be modulated at frequencies up to a few hundreds of mega-hertz, promising them innovative light sources for covert communication and bio-chemical detection.

At the present, commercially available UVB and UVC light-emitting diodes (LEDs) commonly adopt the laminate structure containing a c-plane sapphire as UV transparent substrate, an AlN layer coated over the substrate serving as epitaxy template, and a set of AlN/AlGaN superlattice for dislocation and strain management. The utilization of AlN template and AlN/AlGaN superlattice enables the growth of high-quality high-conductivity n-type AlGaN electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type GaN or InGaN layer for ohmic contact formation. The prior art AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

Prior art UV LEDs suffer from low light output efficiency. Firstly, there is no lattice matched substrate for AlGaN based devices, which means strain management is essential for AlGaN device performance. When using UV transparent sapphire as substrate, an AlN template is inevitable. The AlN template is preferably to be thick, so as to maintain high structural quality. Thick AlN template or bulk AlN substrate exerts large biaxial compression on the overlying AlGaN based device structure, resulting in additional dislocation generation and surface roughness leading to inferior device performance. When forming AlGaN based UV emitters on GaN substrate or template, the UV emitters experience strong biaxial tension from the larger GaN lattice constants. Biaxial tensile strain not only generates dislocations to deteriorate device internal quantum efficiency but also lead to surface cracks which are deadly device defects. In the past, AlN/AlGaN superlattice had been applied to manage strain for AlGaN heteroepitaxy over foreign substrates such as sapphire and GaN (e.g. "Crack-free thick AlGaN grown on sapphire using high temperature AlN/AlGaN superlattice for strain management", J. P. Zhang, et al, Appl. Phys. Lett. 80, 3542 (2002); "AlGaN layers grown on GaN using strain-relief interlayers", C. Q. Chen, et al, Appl. Phys. Lett. 81, 4961 (2002), and U.S. Pat. No. 7,547,925.). And pulsed source supply method was also investigated for high quality AlN and AlGaN epitaxial growth (e.g., U.S. Pat. No. 7,811,847, and "Pulsed Atomic Layer Epitaxy of Ultrahigh-Quality $Al_xGa_{1-x}N$ structures for Deep Ultraviolet Emissions below 230 nm", J. P. Zhang et al, Appl. Phys. Lett. 81, 4392 (2002)). The other drawback of the prior art UV LEDs comes from light extraction, since the employment of UV absorbing p-GaN or p-InGaN contact layer and the large differences in the refractive indexes among air, sapphire, AlN, and AlGaN make light extraction out of the solid state device marginal, usually limiting light extraction efficiency to as small as 6%-10%.

The present invention discloses UV LED structures with greatly improved strain status and improved internal quantum and light extraction efficiencies and the method to form these UV LEDs.

SUMMARY OF THE INVENTION

One aspect of the present invention is directed to a light emitting device, which includes:
an n-type layer;
a p-type layer;
an active region sandwiched between the n-type layer and the p-type layer; and
a lattice constant formatted epitaxial template;
wherein the lattice constant formatted epitaxial template has a growing surface on which the n-type layer grows, and the growing surface has a plurality of first material portions and a plurality of second material portions with each of the first material portions being alternately arranged with each of the second material portions, and wherein lattice constants of the first material portions are different from those of the second material portions.

Another aspect of the present invention is directed to a lattice constant formatted epitaxial template, which includes:
a starting epitaxial template comprising a base, a plurality of alternately arranged protrusions and depressions on the base;
first material portions epitaxially formed on top of the protrusions and second material portions epitaxially formed in the depressions, wherein lattice constants of the first material portions on the protrusions are different from those of the second material portions in the depressions.

Another aspect of the present invention is directed to a light emitting device, which includes:
an n-type layer;
a p-type layer;
an active region sandwiched between the n-type layer and the p-type layer;

wherein the n-type layer contains alternatively arranged first portions and second portions, and lattice constants of the first portions are smaller than lattice constants of the second portions.

Another aspect of the present invention is directed to a light emitting device, which includes:

a p-type layer;

a light emitting active region; and the above described lattice constant formatted epitaxial template;

wherein the active region is directly formed on the first material portions and the second material portions of the lattice constant formatted epitaxial template.

Another aspect of the present invention is directed to a method of making a lattice constant formatted epitaxial template, which includes:

providing a starting epitaxial template having a plurality of alternately arranged protrusions and depressions;

simultaneously and epitaxially growing first material portions on the protrusions and second material portions in the depressions from the same feed material containing at least two elements with different surface diffusion lengths, wherein composition segregation occurs between the first material portions and the second material portions due to the difference in the surface diffusion lengths of the at least two elements and the dimensions of the protrusions and the depressions.

The method may further include:

providing an epitaxial template substrate; and forming, via a nanoimprint or photolithography and etch process, the protrusions and the depressions on the epitaxial template substrate to obtain the starting epitaxial template, wherein the protrusions have a lateral dimension of 100-3000 nm, a height of 200-5000 nm, and a pitch of 200-3500 nm.

In the above method, the first material portions and the second material portions are made of AlGaN via the feed material including trimethylaluminium (TMA), trimethylgallium (TMG), and ammonia.

The method may further include:

forming an n-type layer on the first and second material portions;

forming an active region over the n-type layer; and forming a p-type layer over the active region.

The method may further include removing the starting epitaxial template, the first material portions and the second material portions so as to expose the n-type layer.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

The present invention discloses a lattice constant formatted epitaxial template for a light emitting device with improved internal quantum and light extraction efficiencies. Throughout the specification, the term III-nitride or nitride in general refers to metal nitride with cations selecting from group MA of the periodic table of the elements. That is to say, III-nitride includes MN, GaN, InN and their ternary (AlGaN, InGaN, InAlN) and quaternary (AlInGaN) alloys. In this specification, a quaternary can be reduced to a ternary for simplicity if one of the group III elements is significantly small. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$. A III-nitride layer or active-region means that the layer or active-region is made of III-nitride semiconductors.

In the following contents, wurtzite c-plane nitride light-emitting devices or structures are used as embodiments to elucidate the principle and spirit of the present invention. Those of ordinary skills in the field can apply the teachings in this specification and given by the following embodiments to non-c-plane nitride semiconductors, II-VI semiconductors and other lattice-mismatched light-emitting devices or semiconductor devices without creative work.

Figure 1:
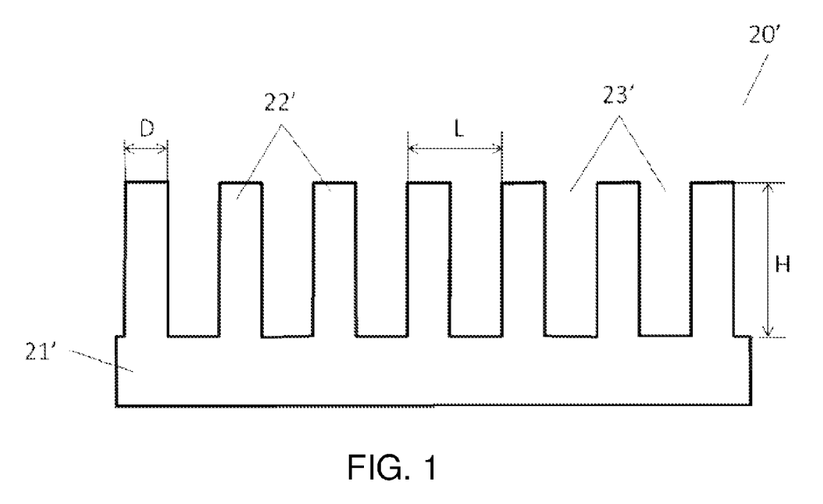
FIG. 1 illustrates the cross sectional schematic drawing of a starting epitaxial template according to an embodiment of the present invention.
Figure 2A:
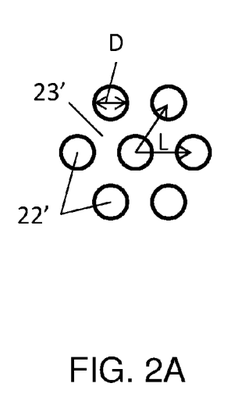
FIG. 2A illustrates a close packed hexagonal pattern for two-dimensional periodic arrangement of protrusions of the starting epitaxial template shown in FIG. 1.
Figure 2B:
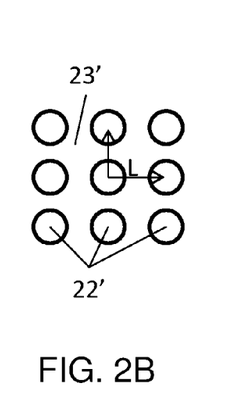
FIG. 2B illustrates a square pattern for two-dimensional periodic arrangement of protrusions of the starting epitaxial template shown in FIG. 1.
Figure 2C:
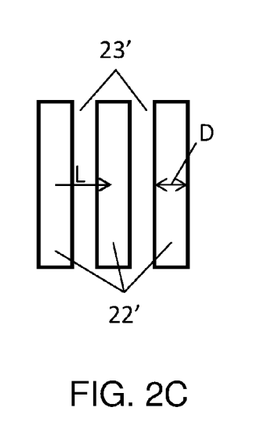
FIG. 2C illustrates a stripe pattern for one-dimensional periodic arrangement of protrusions of the starting epitaxial template shown in FIG. 1.

Illustrated in FIG. 1 is the cross sectional schematic drawing of a starting epitaxial template 20' according to an embodiment of the present invention. Starting epitaxial template 20' includes a base 21', a set of upwardly pointing protrusions 22', which sit on one surface of base 21' and are separated from each other by depressions 23'. The in-plane arrangement of protrusions 22' can take any two-dimensional or one-dimensional patterns. For example, protrusions 22' can be stripes lying on one surface of base 21', as shown in FIG. 2C in bird's eye view. Preferably, protrusions 22' are arranged on base 21' periodically, possessing repeating unit cell and pitch L. Here, pitch L is defined as the sum of lateral dimension of a protrusion 22' and the distance in the same lateral direction between the protrusion and its nearest neighboring protrusion. Refer to FIG. 2C and FIG. 1, protrusions 22' are parallel stripes with a lateral dimension D and a height H, and are spaced from each other by a distance of pitch L minus lateral dimension D. FIG. 2A, and FIG. 2B illustrate two cases of two-dimensional periodic arrangement of protrusions 22' within the surface of base 21'. In FIG. 2A, protrusions are arranged in close packed hexagonal pattern, with in-plane pitches L, and lateral dimension D, whereas in FIG. 2B the arrangement pattern changes into square pattern. Refer to FIGS. 1, 2A and 2B, protrusions 22' are circular pillars sitting on base 21'. Protrusions 22' can also be pillars with other shape, such as hexagon, triangle, or other regular or irregular shape. While protrusion 22' may occupy one surface of base 21' via one-dimensional or two-dimensional periodic patterns, they may also be arranged on the surface of base 21' randomly.

According to an embodiment of the present invention, starting epitaxial template 20' is intended for high-quality AlGaN layer epitaxy (ternary AlGaN or with a trace amount of Indium as previously explained). Hence starting epitaxial template 20' is preferably made of materials suitable for AlGaN epitaxy, such as crystal sapphire, AlN, SiC, GaN, AlGaN, Si et al. Starting epitaxial template 20' can be a self supporting substrate made of the abovementioned materials, or can be a thin film made of the abovementioned materials formed over a supporting substrate (though for simplicity the substrate is not explicitly shown in FIG. 1). Further, the parameters D, H, and L are selected to assure good epitaxy process for a nitride layer such as AlGaN layer. The ranges of these parameters are set as follows: lateral dimension D: 100-3000 nm, height H: 200-1500 nm, pitch L: 200-3500 nm. The following discussion lays out the physics behind the parameter selections.

Figure 3:
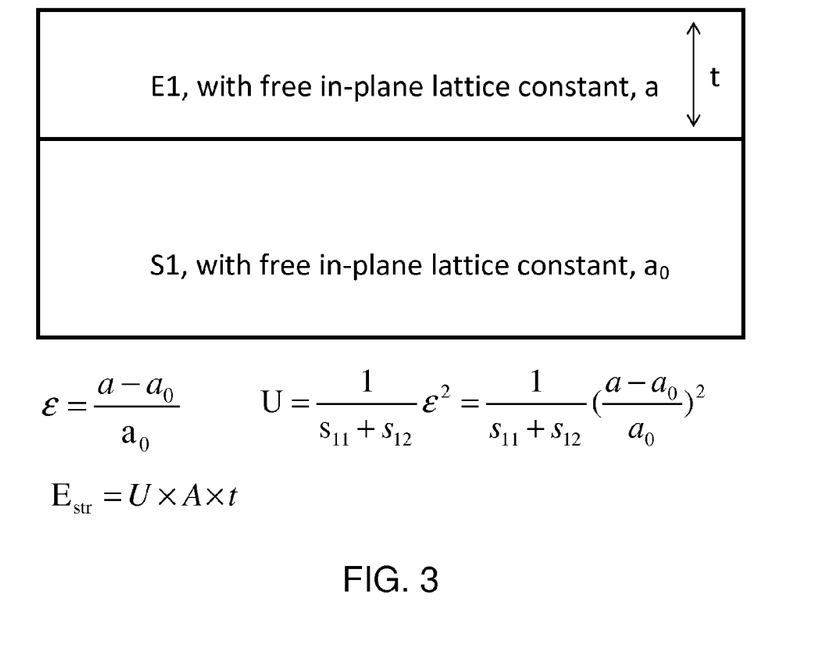
FIG. 3 illustrates a generalized schematic diagram of a heteroepitaxial structure.

It is well known to the field of interest that there is no lattice matched substrate for AlGaN based UV light emitters. So, AlGaN based UV devices have to be heteroepitaxially formed over foreign substrate or template. Shown in FIG. 3 is a generalized schematic diagram illustrating a heteroepitaxial structure, containing a substrate S1 with free in-plane lattice constant $a_0$ and an epilayer E1 with free in-plane lattice constant a. Presumably, substrate S1 is of substantially thick thickness and epilayer E1 of substantially thin thickness, so that strain energy can be viewed as only exerted within epilayer E1. That is to say, substrate S1 will maintain its free lattice constant and epilayer E1 will deform its lattice constant to comply with the epitaxial growth relationship. The unit strain energy, i.e., the strain energy per unit volume for a wurtzite (0001) plane heteroepitaxial structure is (Reference: J. Shen et al, J. Crystal Growth, 240, 6, (2002).), $$U = \frac{1}{s_{11}+s_{12}}\varepsilon^2 = \frac{1}{s_{11}+s_{12}}\left(\frac{a-a_0}{a_0}\right)^2$$

where $s_{ij}$ are the elastic compliance coefficients of epilayer E1, and the strain $\varepsilon$ is, $$\varepsilon = \frac{a-a_0}{a_0}$$

So, the total strain energy within epilayer E1 is, $$E_{str} = U \times A \times t$$

where A, t are the area and thickness of epilayer E1, respectively. As seen, the total strain energy is proportional to epilayer's area and thickness. The strain energy gets larger as the epilayer gets thicker. If it is larger than the dislocation formation energy, dislocations will be generated within epilayer E1; if it is tensile strain and larger than the crack formation energy, cracks will be generated within epilayer E1. Generally speaking, crack formation energy is much higher than dislocation formation energy. The total strain energy equation tells that to achieve high-quality epilayer with thick thickness without dislocation or crack generation, a promising approach is to limit the epilayer area thus limiting the strain energy.

Figure 4:
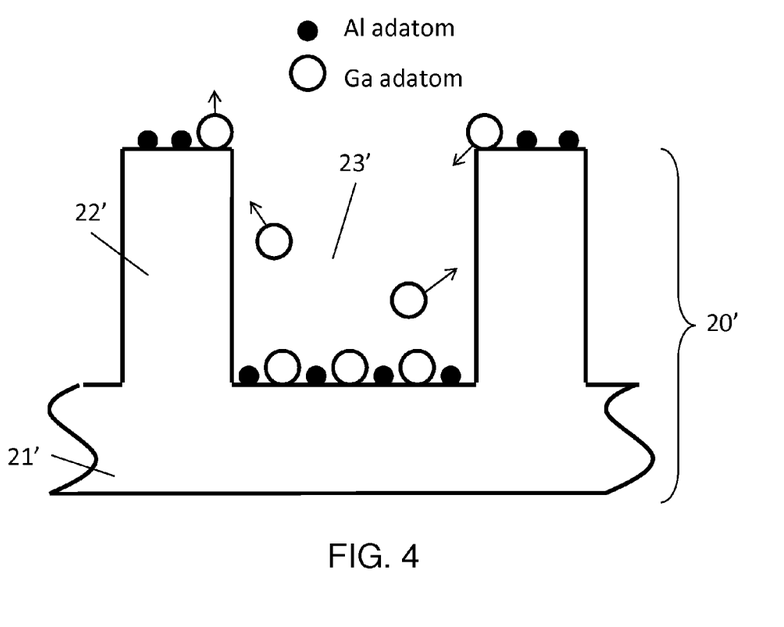
FIG. 4 illustrates a part of a starting epitaxial template to highlight AlGaN epitaxy process on the starting epitaxial template according to an embodiment of the present invention.
Figure 5:
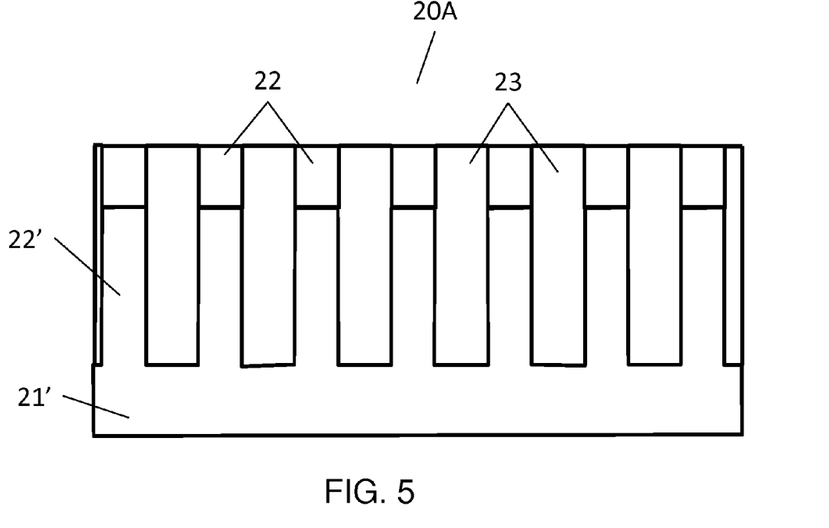
FIG. 5 illustrates an in-plane compositionally formatted thus lattice constant formatted epitaxial template according to an embodiment of the present invention.

FIG. 4 illustrates a part of a starting epitaxial template 20' to highlight AlGaN epitaxy process on the starting epitaxial template. Gallium and Indium adatoms are generally more mobile than Aluminum adatoms. Under optimal AlGaN epitaxial growth conditions (e.g., growth temperature 1050-1120° C., pressure 40-100 torr, V/III ratio 500-3000), Ga adatoms possess diffusion length at least 100 times larger than that of Al adatoms. In literature there are reports that Ga adatoms diffusion length on (0001) GaN surface can be in-between 6 to 24 microns, whereas Al adatoms only possess diffusion length less than 100 nm even at more elevated growth temperatures. As a result, Al adatoms (black dots shown in FIG. 4) basically sticks to wherever they land on the growing surface, and Ga adatoms (circles in FIG. 4) move around to find their most energetically favorable lattice sites, which are usually available in the surface dent, step or kink area. That is to say, making certain surface features can result in segregation of less mobile and highly mobile adatoms, directly leading to composition segregation in the epilayer so formed. Long diffusion length of Ga adatom can also result in desorption from the growing surface. When performing AlGaN epitaxial growth on starting epitaxial template 20', because of Ga adatoms' desorption, besides their diffusion into and trap within depressions 23', the epilayers on top of protrusion 22' (i.e., material portions 22 or portions 22 in FIGS. 5-7) are highly Al-rich AlGaN layers, hence with smaller lattice constants, whereas the epilayers within depressions 23' (i.e., material portions 23 or portions 23 in FIGS. 5-7) are Ga-rich AlGaN layers, hence with larger lattice constants. Also, the growth rate in the depressions 23' will be higher than that on protrusions 22', eventually leading to planarization of starting epitaxial template 20' and resulting in an in-plane compositionally formatted thus lattice constant formatted epitaxial template 20A, as shown in FIG. 5. To have high Al-composition contrast between portions 22 and 23 in FIG. 5, the parameters D, H, and L of starting epitaxial template 20' have to be selected to enhance Ga adatoms surface diffusion. For this purpose, the parameters are set to be within the range: lateral dimension D: 100-3000 nm, height H: 200-1500 nm, pitch L: 200-3500 nm, more preferably to be within the range: lateral dimension D: 100-1000 nm, height H: 200-1000 nm, pitch L: 200-1500 nm Under certain circumstances, the Al-compositions of portions 22 and 23 can be predicted. When growth conditions allowing Al and Ga incorporation efficiencies (defined as the efficiency of gaseous phase Al or Ga atoms incorporating into solid phase Al or Ga atoms) to be equal, and the lateral dimension D of protrusion 22' is much larger than the Al adatom surface diffusion length but much smaller than the Ga adatom surface diffusion length, then the Al compositions of portions 22 and 23 depend on the surface area ratio of protrusions 22' and depressions 23'. For example, under the above specified conditions, if the Al/Ga molar flow ratio in the gaseous phase is 1, and the surface ratio of protrusions 22' to depressions 23' equals to 1, then the Al-compositions of portions 22 and 23 will be predicted to be substantially around 100% and 33%, respectively.

Figure 6:
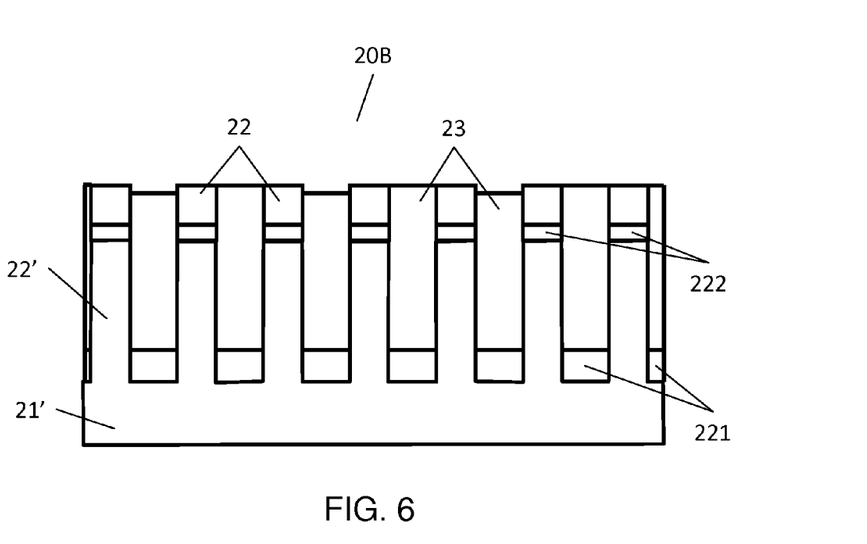
FIG. 6 illustrates an in-plane compositionally formatted thus lattice constant formatted epitaxial template according to another embodiment of the present invention.
Figure 7:
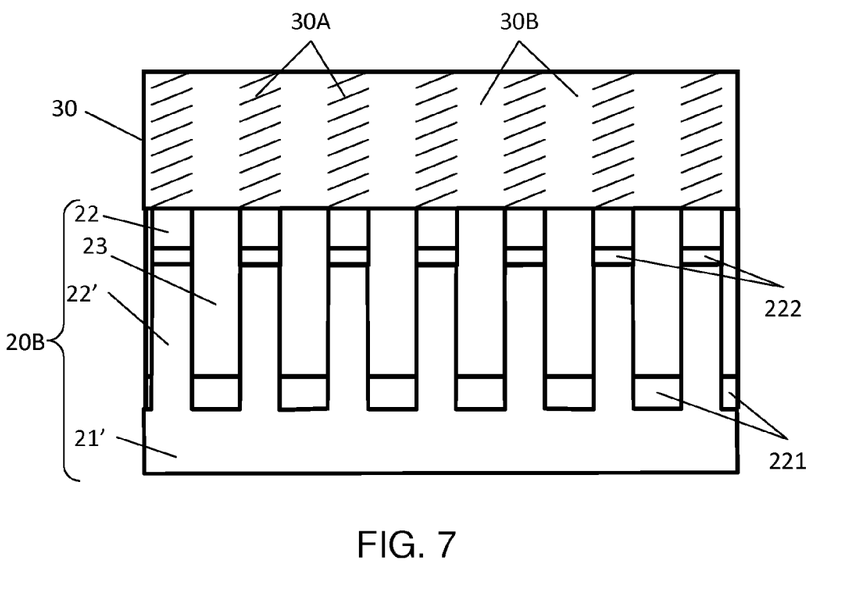
FIG. 7 illustrates an n-type layer, such as an AlGaN layer, epitaxially formed over a lattice constant formatted epitaxial template according to an embodiment of the present invention.

The lattices of portions 22 and 23 are preferably to be relaxed or partly relaxed, via misfit dislocation generation at the interfaces between portions 22 and protrusions 22', and between portions 23 and base 21', respectively. The threading dislocations associated with the above mentioned misfit dislocations are provided with termination sites along the sidewalls of protrusions 22' and portions 22 and 23. To further facilitate threading dislocation termination to the sidewalls, dislocation bending structure such as an AlN inserting layer, or a set of AlN/AlGaN superlattice or multiple layers is formed on starting epitaxial template 20', as shown in FIG. 6. The dislocation bending structures are marked as layer 222 and 221 on top of protrusions 22' and base 21', respectively. If the dislocation bending structure (222, 221) is an AlN insertion layer, its thickness is preferably in-between 5-50 nm. In case the dislocation bending structure is AlN/AlGaN superlattice, the superlattice period can be 5-20 pairs, with individual AlN and AlGaN thickness to be 2-10 nm, and 10-200 nm, respectively, whereas the composition of the AlGaN layers within the superlattice can nominally be the same as those of portions 22 and 23, respectively.

Lattice constant formatted templates 20A and 20B as shown in FIG. 5 and FIG. 6 inherit the high structural quality of starting epitaxial template 20', yet with in-plane formatted composition and the resultant formatted lattice constants. When using template 20A or 20B for AlGaN based UV light emitters, the strain status will be fundamentally different from that of the prior art UV light emitters. In the prior art UV light emitters, for those formed over AlN template or bulk AlN substrate, the whole UV light emitters will be under biaxially compressive strain, which causes dislocation generation and epitaxial three-dimensional growth, resulting in rough surface and inferior device performance. The strain exerted to AlGaN epilayer grown on bulk AlN is within 0%-2.51% depending on Al-composition of AlGaN layer. Meanwhile, for AlGaN based UV emitters formed over GaN template or substrate, the whole device structure will be under biaxially tensile strain of −2.45%-0%, depending on Al-composition. This tensile strain tends to generate cracks within the UV emitters. To summarize, strain within the prior art UV emitters maintains the same sign for the whole epitaxial area, as a result, the device performance is very vulnerable to strain as strain energy is proportional to strained area.

Since templates 20A and 20B shown in FIG. 5 and FIG. 6 possess formatted lattice constants, they can locally biaxially exert different type of strains to films formed over them. For example, referring to FIG. 7, an n-type AlGaN layer 30 is epitaxially formed on template 20B, with Al-composition being lower than that of portions 22 yet higher than that of portions 23. As such, portions 22 and 23 will exert biaxially compressive and tensile strain, respectively to the layer portions epitaxially formed on them. That is to say, layer portions 30A grown on top of portions 22 and layer portions 30B grown on top of portions 23 are under biaxially compressive and tensile strain, respectively. N-type AlGaN layer 30 thus contains alternatively arranged in-plane tensile and compressive portions (30A and 30B), wherein the tensile portions (30B) are of larger in-plane lattice constants as compared to the compressive portions (30A), even though the tensile and compressive portions are of the same compositions. Templates 20A and 20B thus break down the otherwise large-area substantially uniform strain into numerous opposite-sign strains spaced by each other. Since each individual portions 30A and 30B of layer 30 has very limited area (defined by parameter D and pitch L), layer 30 can coherently grow up to a greater thickness on template 20A or 20B without defect especially crack generation thanks to the reduced strain energy and sidewalls for threading dislocation termination. In some embodiments, layer 30 can coherently grow on template 20A or 20B up to more than 2 μm without lattice relaxation. In other embodiments, when the layer thickness is substantially thick, for example, more than 4 μm, layer 30 can be partly relaxed on the surface portion away from template 20A or 20B. Still in other embodiments, when the layer thickness is substantially thick, for example, more than 6 μm, layer 30 can be fully relaxed on the surface portion away from template 20A or 20B, with the surface portion close to template 20A or 20B still being strained. Coherent or partly relaxed layer 30 can transfer its formatted in-plane lattice constant to the following thin film, such as a light emitting layer or MQW structure, grown on layer 30.

According to some embodiments of the present invention, starting epitaxial template 20' is made of AlN. It can be a bulk AlN substrate, or can be an AlN thin film with thickness preferably greater than 2 μm, formed over another substrate such as sapphire, SiC, or Si. The protrusions 22' are made of AlN, arranged over the base 21' also being AlN, according to the patterns shown in FIGS. 2A-2C. The parameters D, H, and L are respectively selected to be 200, 1000, and 500 nm in this embodiment. The protrusions 22' and depressions 23' of template 20' according to this embodiment are formed via nanoimprint process, which is a commercially available technique used in nano-fabrication. Reference of the nanoimprint process can be found in U.S. Pat. No. 7,419,764 which is herein incorporated by reference in its entirety. The so-formed template 20' is loaded into an metalorganic chemical vapor deposition (MOCVD) reactor, heated up to a temperature of 1100° C. under hydrogen and ammonia ambient, for the formation of lattice-constant formatted template 20A. The formation starts with the simultaneously supply of Al, Ga, and N sources, which can respectively be trimethylaluminium (TMA), trimethylgallium (TMG), and ammonia. The molar flow ratio of TMA and TMG sources are selected to get the desired Al-compositions for the portions 22 and 23, which are different because of the engineered surface structure of template 20' and the large difference in surface diffusion lengths of Al and Ga adatoms, as previously explained. In some embodiments, the molar flow ratio of TMA and TMG sources are selected close to be 1. This will result in an Al-composition greater than 50% for the portions 22, and an Al-composition less than 50% for the portions 23. In some embodiments, the resultant Al-compositions of portions 22 and 23 can be respectively 60% and 45%. In some embodiments, the resultant Al-compositions of portions 22 and 23 can be respectively 70% and 40%. In some embodiments, the resultant Al-compositions of portions 22 and 23 can be respectively 90% and 35%. In some embodiments, the resultant Al-compositions of portions 22 and 23 can be respectively 97% and 48%. The composition difference between portion 22 and 23 is governed by growth temperature and the parameters D, H, and L. It also slightly depends on ammonia flow rate. Upon formation going on, the height difference between portions 22 and 23 will reduce since the growth rate is higher for portions 23. The Al-composition difference between portions 22 and 23 will rather abruptly vanish as the portions' height difference is less than 100 nm in some cases, or less than 50 nm in other cases. Upon achieving this height difference of portions 22 and 23, the planarization is completed, and lattice constant formatted template 20A is achieved, and can be used for the following UV emitter epitaxial formation. In the prior art, UV light emitters formed over bulk AlN substrate or AlN thin film template are under large area constant biaxial compression, leading to dislocation generation and surface roughness. According to the present invention, using the achieved template 20A for AlGaN based UV emitters can result in micron or submicron area scale in-plane strain sign flip and strength modulation, leading to improved material quality and device internal quantum efficiency.

Figure 8:
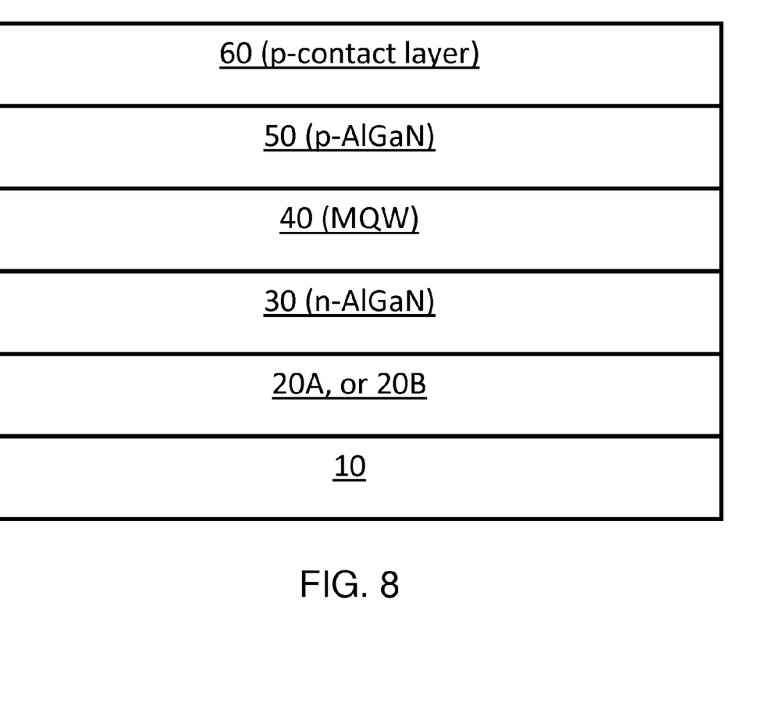
FIG. 8 illustrates a laminate structure of a light emitter, such as a UV light emitter, according to an embodiment of the present invention, formed over a lattice constant formatted epitaxial template.
Figure 9:
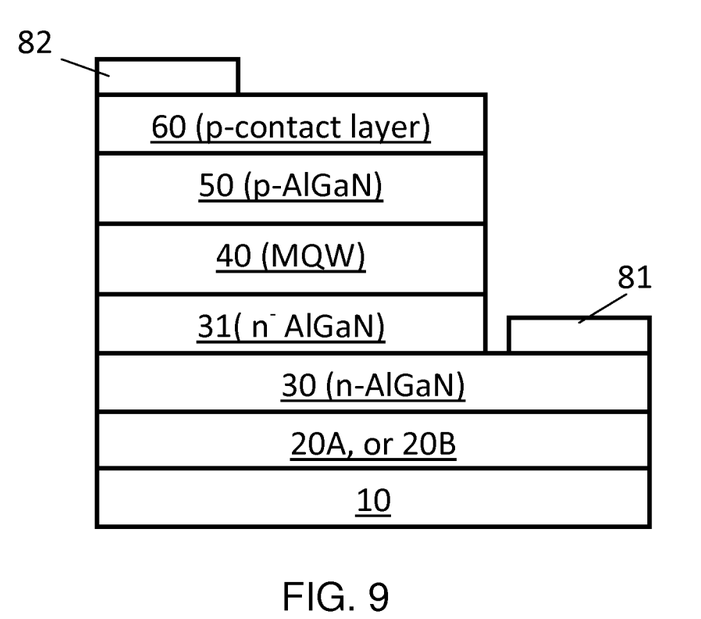
FIG. 9 illustrates a laminate structure of a light emitter, such as a UV light emitter, according to an embodiment of the present invention, formed over a lattice constant formatted epitaxial template.

The laminate structure of a UV light emitter according to one embodiment of the present invention is illustrated in FIG. 8, where the lattice constant formatted template 20A, or 20B is employed, and is optionally formed upon a substrate 10 (note that in the case that starting epitaxial template 20' is made of a bulk AlN substrate, substrate 10 in FIG. 8 and FIG. 9 is omitted). Substrate 10 can be selected from sapphire, SiC, Si, and the like. Template 20A, or 20B is made of AlN with AlGaN in-plane composition formatted portions 22 and 23 according FIG. 5 or FIG. 6. Coherently lying on template 20A or 20B is an n-AlGaN layer 30, which is under micron or submicron scale in-plane strain sign flip and strength modulation, as is revealed in FIG. 7. As layer 30 is conformally formed on template 20A or 20B, the surface of layer 30 in contact with template 20A or 20B has first portions formed on portions 22 and second portions formed on portions 23, and there may be a difference in height between the first portions and the second portions corresponding to the height difference between portions 22 and portions 23. Layer or film 30 experiencing the in-plane strain modulation maintains high structural quality and electrical conductance, ensuring the following UV light emitting AlGaN based MQW 40 of high internal quantum efficiency, because of the reduced defect density and enhanced electron spreading for uniform electron injection into MQW 40. Formed over MQW 40 is p-type AlGaN layer 50, comprising a p-type electron blocking layer, a hole injection layer, and a hole supplier layer. On top of p-AlGaN layer 50 is a p-type contact layer 60, which can be a p-type GaN or InGaN layer for ohmic contact formation. The UV emitter structure shown in FIG. 8 can be fabricated into a UV light emitting device as shown in FIG. 9, where n- and p-electrical contacts (81, 82) are formed via standard chip fabrication process. The embodiment shown in FIG. 9 can emit UV light either through the substrate 10 (surface emitting device) or along the plane of MQW 40 (side emitting device).

According to some other embodiments of the present invention, starting epitaxial template 20' is made of GaN. It can be a bulk GaN substrate, or can be a GaN thin film with thickness preferably greater than 4 μm, formed over another substrate such as sapphire, SiC, or Si. The protrusions 22' are made of GaN, arranged over the base 21' also being GaN, according to the patterns shown in FIGS. 2A-2C. The parameters D, H, and L are respectively selected to be 300, 1500, and 600 nm in this embodiment. The patterns of template 20' according to this embodiment are formed via nanoimprint process, which is a commercially available technique used in nano-fabrication. Reference of the nanoimprint process can be found in U.S. Pat. No. 7,419,764. The so-formed template 20' is loaded into an metalorganic chemical vapor deposition (MOCVD) reactor, heated up to a temperature of 1100° C. under hydrogen and ammonia ambient, for the formation of lattice-constant formatted template 20A or 20B. The formation starts with the simultaneously supply of Al, Ga, and N sources, which can respectively be trimethylaluminium (TMA), trimethylgallium (TMG), and ammonia. The molar flow ratio of TMA and TMG sources are selected to get the desired Al-compositions for the portions 22 and 23, which are different because of the engineered surface structure of template 20' and the large difference in surface diffusion lengths of Al and Ga adatoms, as previously explained. In some embodiments, the molar flow ratio of TMA and TMG sources are selected close to be 0.9. This will result in an Al-composition greater than 50% for the portions 22, and an Al-composition less than 50% for the portions 23. In some embodiments, the resultant Al-compositions of portions 22 and 23 can be respectively 60% and 45%. In some embodiments, the resultant Al-compositions of portions 22 and 23 can be respectively 70% and 40%. In some embodiments, the resultant Al-compositions of portions 22 and 23 can be respectively 90% and 35%. In some embodiments, the resultant Al-compositions of portions 22 and 23 can be respectively 98% and 48%. The composition difference between portion 22 and 23 is governed by growth temperature and the parameters D, H, and L. It also slightly depends on ammonia flow rate. Upon formation going on, the height difference between portions 22 and 23 will reduce since the growth rate is higher for portions 23. The Al-composition difference between portions 22 and 23 will rather abruptly vanish as the portions' height difference is less than 100 nm in some cases, or less than 50 nm in other cases. Upon achieving this height difference of portions 22 and 23, the planarization is completed, and lattice constant formatted template 20A or 20B is achieved, and can be used for the following UV emitter epitaxial formation. In the prior art, UV light emitters formed over bulk GaN substrate or GaN film template are under large area constant biaxial tension, leading to dislocation generation and surface crack. According to the present invention, using the achieved template 20A or 20B for AlGaN based UV emitters can result in micron or submicron scale in-plane strain sign flip and strength modulation, leading to improved material quality and device internal quantum efficiency.

The laminate structure of a UV light emitter according to an embodiment of the present invention is illustrated in FIG. 8, where the lattice constant formatted template 20A, or 20B is employed, and is optionally formed upon a substrate 10 (note that in the case that starting epitaxial template 20' is made of a bulk GaN substrate, substrate 10 in FIG. 8 and FIG. 9 is omitted). Substrate 10 can be selected from sapphire, SiC, Si, and the like. Template 20A, or 20B is made of GaN with AlGaN in-plane composition formatted portions 22 and 23 according FIG. 5 or FIG. 6. Coherently lying over template 20A or 20B is an n-AlGaN layer 30, which is under micron or submicron scale in-plane strain modulation, as is revealed in FIG. 7. Layer or film 30 experiencing the in-plane strain modulation maintains high structural quality and electrical conductance, ensuring the following UV light emitting AlGaN based MQW 40 of high internal quantum efficiency, because of the reduced defect density and enhanced electron spreading for uniform electron injection into MQW 40. Formed over MQW 40 is p-type AlGaN layer 50, comprising a p-type electron blocking layer, a hole injection layer, and a hole supplier layer. On top of p-AlGaN layer 50 is a p-type contact layer 60, which can be a p-type GaN or InGaN layer for ohmic contact formation. Also notice that in FIG. 9 and FIG. 10, to further force current uniform spreading, a lightly doped n⁻-AlGaN of higher vertical resistance is employed in-between MQW 40 and n-AlGaN 30. The UV emitter structure shown in FIG. 8 can be made into UV light emitting devices. As shown in FIG. 9, n- and p-electrical contacts (81, 82) are formed via standard chip fabrication process. The embodiment shown in FIG. 9 according to this aspect of the present invention can emit UV light along the plane of MQW 40 (side emitting device), i.e., super luminescence light emitting diode or UV laser diode can be fabricated according to this embodiment of the present invention.

Figure 10:
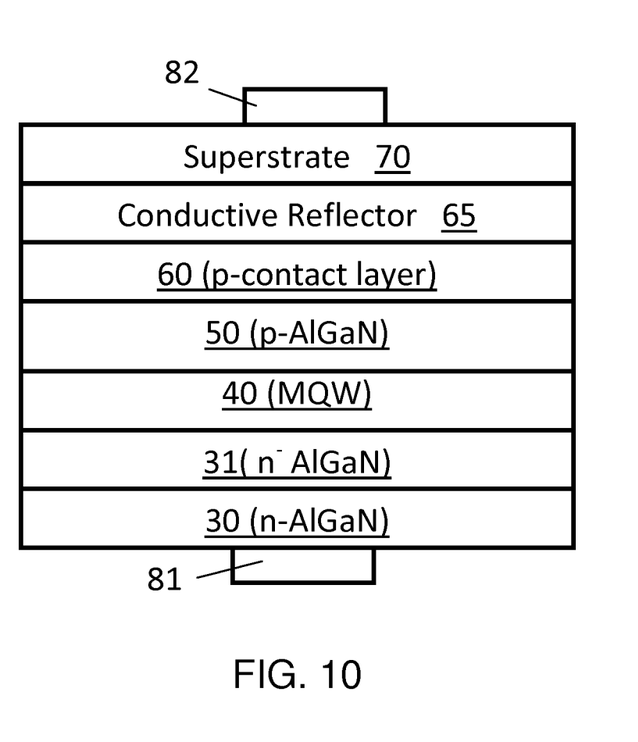
FIG. 10 illustrates the laminate structure of a thin-film UV light emitter according to an embodiment of the present invention, in which the lattice constant formatted epitaxial template is removed upon device fabrication.

Further, for the UV emitter structure shown in FIG. 8, the UV light absorbing template 20A or 20B mostly made of GaN according to this aspect of the present invention can be removed, to make a surface emitting UV LED, as shown in FIG. 10. First a conductive UV light reflector 65 is formed over p-contact layer 60. Then the structure is attached to a superstrate 70 for mechanical support. Superstrate 70 is either electrical conductive or possesses electrical conductive vias, so that p-contact 82 can be formed over superstrate 70. As shown in FIG. 10, lattice constant formatted template 20A, or 20B plus its substrate if any is removed, and n-contact 81 is formed over n-AlGaN layer 30. Since in this aspect of the invention, template 20A or 20B is made mostly of GaN, the removal of it can be readily achieved via laser liftoff process, which is a standard blue LED process at the present. Upon the removal of template 20A or 20B, the exposed surface of n-AlGaN layer 30 can be roughened to enhance UV light extraction through n-AlGaN layer 30. UV LEDs made according to this aspect of the present invention possess both high internal quantum efficiency and high light extraction efficiency.

According to still other embodiments of the present invention, starting epitaxial template 20' is made of sapphire, Si, or SiC substrate. In an exemplary embodiment according to this aspect of the present invention, starting epitaxial template 20' is made of sapphire substrate. The protrusions 22' are made of sapphire, arranged over the base 21' also being sapphire, according to the patterns shown in FIGS. 2A-2C. The parameters D, H, and L are respectively selected to be approximately 1500, 1500, and 3000 nm in this embodiment. The protrusions 22' and depressions 23' of template 20' according to this embodiment are formed via standard semiconductor fabrication process including photolithography and etching. The so-formed template 20' is loaded into an metalorganic chemical vapor deposition (MOCVD) reactor, heated up to a temperature of 1030° C. under hydrogen ambient for surface cleaning. Then at lower temperatures of 520-750° C. an MN layer of 20-100 nm thick is formed over template 20' before being heated up to higher temperatures of 1050-1150° C. for the formation of lattice-constant formatted template 20A. Template 20A formation starts with the simultaneously supply of Al, Ga, and N sources, which can respectively be trimethylaluminium (TMA), trimethylgallium (TMG), and ammonia. The molar flow ratio of TMA and TMG sources are selected to get the desired Al-compositions for the portions 22 and 23, which are different because of the engineered surface structure of template 20' and the large difference in surface diffusion lengths of Al and Ga adatoms, as previously explained. In some embodiments, the molar flow ratio of TMA and TMG sources are selected close to be 1. This will result in an Al-composition greater than 50% for the portions 22, and an Al-composition less than 50% for the portions 23. In some embodiments, the resultant Al-compositions of portions 22 and 23 can be respectively 60% and 45%. In some embodiments, the resultant Al-compositions of portions 22 and 23 can be respectively 70% and 40%. In some embodiments, the resultant Al-compositions of portions 22 and 23 can be respectively 90% and 35%. In some embodiments, the resultant Al-compositions of portions 22 and 23 can be respectively 97% and 48%. The composition difference between portion 22 and 23 is governed by growth temperature and the parameters D, H, and L. It also slightly depends on ammonia flow rate. Upon formation going on, the height difference between portions 22 and 23 will reduce since the growth rate is higher for portions 23. The Al-composition difference between portions 22 and 23 will rather abruptly vanish as the portions' height difference is less than 100 nm in some cases, or less than 50 nm in other cases. Upon achieving this height difference of portions 22 and 23, the planarization is completed, and lattice constant formatted template 20A is achieved, and can be used for the following UV emitter epitaxial formation. The UV light emitter epitaxial and device structures can be the same as shown in FIG. 8 and FIG. 9, but with the absence of substrate 10 shown there.

The embodiments disclosed above take AlGaN lattice constant formatted epitaxial templates and UV light emitters as example. However, the present invention is not limited to AlGaN lattice constant formatted epitaxial templates and UV light emitters. Similarly, InGaN materials (or AlInGaN materials) are suitable for making lattice constant formatted epitaxial template for InGaN thin film epitaxy, in view of the large difference in surface diffusion lengths of In and Ga adatoms under optimal InGaN growth conditions. The optimal InGaN epitaxial growth conditions include high growth pressure of 200-760 torr, lower growth temperatures of 600-850° C., and high V/III ratio of 2000-30000. Under the optimal InGaN growth conditions, Al and Ga adatoms possess small even vanishing surface diffusion lengths, as compared to that of In adatoms. When performing InGaN or AlInGaN epitaxial growth on a starting epitaxial template 20' under the optimal InGaN growth conditions, material portions 22 formed on protrusion 22' will be In-deficient and have smaller lattice constants as compared to material portions 23 formed in depressions 23'. InGaN or AlInGaN lattice constant formatted epitaxial templates are ideal for high-In-content InGaN epitaxy for green, amber and red InGaN light emitters.

According to this aspect of the present invention, starting epitaxial template 20' is made of GaN. It can be a bulk GaN substrate, or can be a GaN thin film with thickness preferably greater than 4 µm, formed over another substrate such as sapphire, SiC, or Si. The protrusions 22' are made of GaN, arranged over the base 21' also being GaN, according to the patterns shown in FIGS. 2A-2C or other suitable patterns. The parameters D, H, and L are selected to be 100-3000 nm, 200-1500 nm, and 200-3500 nm, respectively, more preferably to be 100-1000 nm, 200-1000 nm, and 200-1500 nm, respectively. The parameters D, H, and L are 300, 300, and 600 nm, respectively, in this embodiment. The patterns of template 20' according to this embodiment are formed via nanoimprint process, which is a commercially available technique used in nano-fabrication. Reference of the nanoimprint process can be found in U.S. Pat. No. 7,419,764. The so-formed template 20' is loaded into an metalorganic chemical vapor deposition (MOCVD) reactor, heated up to a temperature of 720-850° C. under nitrogen and ammonia ambient to meet the optimal InGaN epitaxial growth conditions for the formation of lattice-constant formatted template 20A. The formation starts with simultaneously supply of In, Ga, and N sources, which can respectively be trimethylindium (TMI), trimethylgallium (TMG), and ammonia. The molar flow ratio of TMI and TMG sources and the formation temperature are selected to get the desired In-compositions for the portions 22 and 23, which are different because of the engineered surface structure of template 20' and the large difference in surface diffusion lengths of In and Ga adatoms, as previously explained. In some embodiments, the molar flow ratio of TMI and TMG sources are selected close to be 2.0, and the formation temperature is selected to be 800° C. This will result in an In-composition greater than 8% for the portions 23, and an In-composition less than 3% for the portions 22. In some embodiments, the resultant In-compositions of portions 22 and 23 can be respectively 1.0% and 13%. In some embodiments, the resultant In-compositions of portions 22 and 23 can be respectively 2.5% and 10%. In some embodiments, the resultant In-compositions of portions 22 and 23 can be respectively 2% and 12%. In some embodiments, the resultant Al-compositions of portions 22 and 23 can be respectively 3% and 9%. The composition difference between portion 22 and 23 is governed by growth temperature and the parameters D, H, and L. It also slightly depends on ammonia flow rate. Upon formation going on, the height difference between portions 22 and 23 will reduce since the growth rate is higher for portions 23. The In-composition difference between portions 22 and 23 will rather abruptly vanish as the portions' height difference is less than 50 nm in some cases, or less than 20 nm in other cases. Upon achieving this height difference of portions 22 and 23, the planarization is completed, and lattice constant formatted epitaxial template 20A is achieved, and can be used for the following InGaN visible light emitter epitaxial formation. In the prior art, InGaN visible light emitting MQW formed over bulk GaN substrate or GaN film template are under large area constant biaxial compression, leading to dislocation generation and large piezoelectric polarization. According to the present invention, using the achieved template 20A for InGaN MQW based visible light emitters can result in micron or submicron scale in-plane strain sign flip and strength modulation, leading to improved material quality and device internal quantum efficiency.

Figure 11:
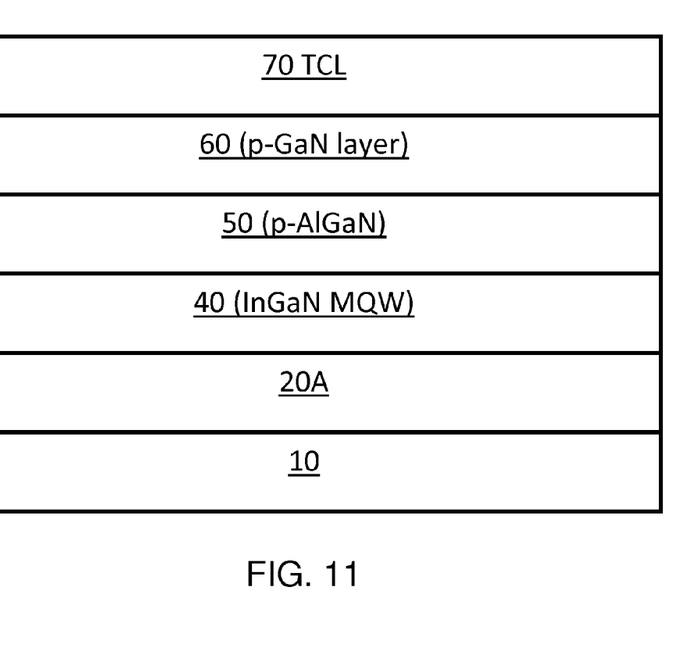
FIG. 11 illustrates a laminate structure of a light emitter, such as a visible light emitter, according to an embodiment of the present invention, formed over a lattice constant formatted epitaxial template.

The laminate structure of a visible light emitter according to an embodiment of the present invention is illustrated in FIG. 11, where an InGaN lattice constant formatted epitaxial template 20A is employed, and is optionally formed upon a substrate 10 (note that in the case that starting epitaxial template 20' is made of a bulk GaN substrate, substrate 10 in FIG. 11 is omitted). Substrate 10 can be selected from sapphire, SiC, Si, and the like. Template 20A is made of GaN with InGaN in-plane composition formatted portions 22 and 23 according FIG. 5. Coherently formed on template 20A can be a n-type layer 30 made of InGaN material (not shown in FIG. 11), or directly coherently lying on template 20A is an InGaN based MQW such as an InGaN/InGaN or GaN/InGaN MQW 40, which is under micron or submicron scale in-plane strain modulation, because of the different In-compositions of portions 22 and 23 as shown in FIG. 5. InGaN MQW 40 experiencing the in-plane strain modulation maintains high structural quality and suffers from less strain, ensuring high internal quantum efficiency and reduced forward turn on voltage because of the reduced defect density and piezoelectric polarization. Formed over MQW 40 is p-type AlGaN layer 50. On top of p-AlGaN layer 50 is a p-type contact layer 60, which can be a p-type GaN or InGaN layer for ohmic contact formation. Finally, a transparent conductive layer (TCL) 70, such as an indium tin oxide (ITO) layer is formed over layer 60 for current spreading and light extraction.

When the active region is directly formed on an InGaN or AlGaN lattice constant formatted epitaxial template, material portions 22 and 23 of lattice constant formatted epitaxial template 20A or 20B may function as n-type layer and, for that purpose, material portions 22 and 23 can be properly doped.

The principal of the present invention can be readily extended to other semiconductor devices as long as there is strain to mediate. According to the teachings taught above, using a lattice constant formatted epitaxial template can split the otherwise large-area, substantially uniform, biaxially compressive or tensile strain into numerous miniature areas of strains with reduced and opposite-signed strains. The general steps to form a lattice constant formatted epitaxial template consist:

Identifying a starting epitaxial template material and an epitaxial material that can be epitaxially formed over the template material, whereas the epitaxial material shall contain at least two different elements which possess substantially different diffusion lengths when performing epitaxial growth of the epitaxial material on the epitaxial template;

Forming protrusions and depressions on the epitaxial template material to make a starting epitaxial template. The dimensions of the protrusions and depressions shall take the advantage of the different diffusion lengths of the at least two different elements of the epitaxial material, to make the epitaxially formed materials on top of the protrusions and depressions have different compositions thus different lattice constants.

Performing epitaxial growth on the starting epitaxial template. The growth conditions shall facilitate the composition segregation due to the difference of the at least two different elements' surface diffusion lengths. The lattice constant formatted template will be accomplished as the starting epitaxial template approaches surface planarization.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A light emitting device comprising:
an n-type layer;
a p-type layer;

an active region sandwiched between the n-type layer and the p-type layer; and a lattice constant formatted epitaxial template;

wherein the lattice constant formatted epitaxial template has a growing surface on which the n-type layer grows, and the growing surface comprises a plurality of first material portions and a plurality of second material portions with each of the first material portions being alternately arranged with each of the second material portions, and wherein lattice constants of the first material portions are different from those of the second material portions.

2. The light emitting device according to claim 1, wherein each of the first material portions and each of the second material portions are of lateral dimension from 100 nm to 3000 nm in at least one lateral direction, respectively.

3. The light emitting device according to claim 1, wherein the first and second material portions are made of AlGaN, the Al-composition of the first material portions is higher than the Al-composition of the second material portions, thus the lattice constants of the first material portions are smaller than those of the second material portions.

4. The light emitting device according to claim 3, wherein the n-type layer is made of AlGaN, the Al-composition of the n-type layer is lower than the Al-composition of the first material portions and higher than the Al-composition of the second material portions, thus the lattice constants of the n-type layer are larger than the lattice constants of the first material portions and smaller than the lattice constants of the second material portions.

5. The lattice constant formatted epitaxial template according to claim 1, wherein there is a height difference between the first material portions and the second material portions in a layer growing direction, and the height difference is larger than 100 nanometers.

6. Light emitting device according to claim 1, wherein the n-type layer is an n-type AlGaN layer and the active region emits ultraviolet emissions in the wavelengths of 230-365 nm.

7. A lattice constant formatted epitaxial template comprising:

a starting epitaxial template comprising a base, a plurality of alternately arranged protrusions and depressions on the base;

first material portions epitaxially formed on top of the protrusions and second material portions epitaxially formed in the depressions, wherein lattice constants of the first material portions on the protrusions are different from those of the second material portions in the depressions.

8. The lattice constant formatted epitaxial template according to claim 7, wherein the protrusions are arranged on the base in a one-dimensional or two-dimensional periodic pattern, and the protrusions are of lateral dimension of 100-3000 nm, height of 200-1500 nm and pitch of 200-3500 nm.

9. The lattice constant formatted epitaxial template according to claim 7, wherein the lattice constants of the first material portions are smaller than those of the second material portions.

10. The lattice constant formatted epitaxial template according to claim 7, wherein the starting epitaxial template is made of MN, and the first and second material portions are made of AlGaN, wherein the Al-composition of the first material portions is higher than the Al-composition of the second material portions, thus the lattice constants of the first material portions are smaller than those of the second material portions.

11. The lattice constant formatted epitaxial template according to claim 7, wherein the starting epitaxial template is made of GaN, and the first and second material portions are made of AlGaN, wherein the Al-composition of the first material portions is higher than the Al-composition of the second material portions, thus the lattice constants of the first material portions are smaller than those of the second material portions.

12. The lattice constant formatted epitaxial template according to claim 7, wherein the starting epitaxial template is made of AlGaN, sapphire, SiC, or Si, and the first and second material portions are made of AlGaN, wherein the Al-composition of the first material portions is higher than the Al-composition of the second material portions, thus the lattice constants of the first material portions are smaller than those of the second material portions.

13. The lattice constant formatted epitaxial template according to claim 7, wherein the first and second material portions are simultaneously formed on the protrusions and in the depressions, respectively, from the same feed material via composition segregation.

14. The lattice constant formatted epitaxial template according to claim 7, wherein there is a height difference between the first material portions and the second material portions in a layer growing direction, and the height difference is larger than 100 nanometers.

15. A light emitting device comprising:

an n-type layer;

a p-type layer;

an active region sandwiched between the n-type layer and the p-type layer;

wherein the n-type layer contains first portions and second portions alternately arranged along a lateral direction of the n-type layer, and lattice constants of the first portions are smaller than lattice constants of the second portions.

16. The light emitting device according to claim 15, wherein each of the first portions and each of the second portions has a lateral dimension from 100 nm to 3000 nm in at least one lateral direction, respectively.

17. The light emitting device according to claim 15, wherein the n-type layer is an unrelaxed layer.

18. The light emitting device according to claim 15, wherein the n-type layer is a fully relaxed layer, and the first and second portions are formed within a sublayer of the fully relaxed n-type layer.

19. The light emitting device according to claim 15, wherein the n-type layer is a AlGaN layer or an InGaN layer.

20. A light emitting device comprising:

a p-type layer;

a light emitting active region; and the lattice constant formatted epitaxial template according to claim 7;

wherein the active region is directly formed on the first material portions and the second material portions of the lattice constant formatted epitaxial template.

21. The light emitting device according to claim 20, wherein the first and second material portions are made of InGaN and the In-composition of the second material portions is higher than that of the first material portions.

22. The light emitting device according to claim 21, wherein the active region is made of InGaN light emitting quantum wells for emitting visible light.

* * * * *